US011830751B2

(12) United States Patent
Matsuyama et al.

(10) Patent No.: US 11,830,751 B2
(45) Date of Patent: Nov. 28, 2023

(54) PLASMA PROCESSING APPARATUS AND PLASMA PROCESSING METHOD

(71) Applicant: TOKYO ELECTRON LIMITED, Tokyo (JP)

(72) Inventors: Shoichiro Matsuyama, Miyagi (JP); Daiki Satoh, Miyagi (JP); Yasuharu Sasaki, Miyagi (JP); Takashi Nishijima, Miyagi (JP); Jinyoung Park, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 284 days.

(21) Appl. No.: 17/232,226

(22) Filed: Apr. 16, 2021

(65) Prior Publication Data

US 2021/0233794 A1 Jul. 29, 2021

Related U.S. Application Data

(63) Continuation of application No. 16/129,941, filed on Sep. 13, 2018, now Pat. No. 11,004,717.

(30) Foreign Application Priority Data

Sep. 15, 2017 (JP) .................................. 2017-177398

(51) Int. Cl.
*H01L 21/683* (2006.01)
*H01J 37/32* (2006.01)
(Continued)

(52) U.S. Cl.
CPC .... *H01L 21/6833* (2013.01); *H01J 37/32009* (2013.01); *H01J 37/32642* (2013.01);
(Continued)

(58) Field of Classification Search
CPC ............. H01L 21/3065; H01L 21/6833; H01L 21/68735; H01L 21/67109; H01J 37/32642; H01J 37/32009
See application file for complete search history.

(56) References Cited

U.S. PATENT DOCUMENTS

2004/0261946 A1* 12/2004 Endoh ................. H01L 21/6831
156/345.1
2011/0209828 A1 9/2011 Nishio et al.
(Continued)

FOREIGN PATENT DOCUMENTS

JP 2008-244274 A 10/2008
JP 2010-183074 A 8/2010
(Continued)

OTHER PUBLICATIONS

Office Action issued for Chinese Patent Application No. 201811073526.7 dated May 15, 2020 (10 pages).

*Primary Examiner* — Yuechuan Yu
(74) *Attorney, Agent, or Firm* — XSENSUS LLP

(57) ABSTRACT

A plasma processing apparatus includes a base, an electrostatic chuck provided on the base, and a dielectric layer. A bias power, whose magnitude is changed during plasma processing on a target substrate, is applied to the base. The electrostatic chuck has a central portion on which the target substrate is mounted and an outer peripheral portion on which a focus ring is mounted to surround the target substrate. The dielectric layer is provided between the outer peripheral portion of the electrostatic and the base or the focus ring and has an electrostatic capacitance that reduces a difference between an electrostatic capacitance of the central portion of the electrostatic chuck and an electrostatic capacitance of the outer peripheral portion of the electrostatic chuck.

12 Claims, 6 Drawing Sheets

(51) Int. Cl.
*H01L 21/687* (2006.01)
*H01L 21/3065* (2006.01)
*H01L 21/67* (2006.01)

(52) U.S. Cl.
CPC .... *H01L 21/3065* (2013.01); *H01L 21/68735* (2013.01); *H01L 21/67109* (2013.01)

(56) References Cited

U.S. PATENT DOCUMENTS

2016/0351378 A1   12/2016  Kishi et al.
2017/0352566 A1*  12/2017  Ramaswamy ...... H01L 21/6833

FOREIGN PATENT DOCUMENTS

| JP | 2010-186841 A | 8/2010 |
| JP | 2015-95409 A | 5/2015 |
| JP | 2016-048771 A | 4/2016 |
| JP | 2016-225588 A | 12/2016 |
| JP | 2018-148162 A | 9/2018 |

* cited by examiner

| BIAS POWER | COMPARATIVE EXAMPLE | TEST EXAMPLE 1 | TEST EXAMPLE 2 |
|---|---|---|---|
| 2000W | Θ=−0.69deg | Θ=−0.02deg | Θ=0.20deg |
| 14000W | Θ=−0.21deg | Θ=−0.08deg | Θ=−0.15deg |
| | ΔΘ=−0.48deg | ΔΘ=0.06deg | ΔΘ=0.35deg |

PLASMA PROCESSING APPARATUS AND PLASMA PROCESSING METHOD

CROSS-REFERENCE TO RELATED APPLICATIONS

This application is a continuation of U.S. patent application Ser. No. 16/129,941, filed Sep. 13, 2018, which claims priority to Japanese Patent Application No. 2017-177398, filed on Sep. 15, 2017, priority is claimed to each of the foregoing and the entire contents of which are incorporated herein by reference.

FIELD OF THE INVENTION

The present disclosure relates to a plasma processing apparatus and a plasma processing method.

BACKGROUND OF THE INVENTION

In a semiconductor device manufacturing process, a plasma processing apparatus for performing processing such as etching or the like on a target substrate, e.g., a semiconductor wafer, by applying the plasma of a processing gas to the target substrate, is used. In the plasma processing apparatus, a target substrate is mounted on a central portion of an electrostatic chuck provided on a base (susceptor), and a focus ring is provided on an outer peripheral portion of the electrostatic chuck to surround the target substrate. The focus ring improves the uniformity of the plasma processing such as etching or the like performed on the target substrate. A high frequency bias power for attracting ions in plasma may be applied to the target substrate.

In the semiconductor device manufacturing process, when high aspect ratio etching is performed on a semiconductor wafer, a phenomenon (tilting) in which a contact hole is inclined in a region of the wafer (e.g., a peripheral region of the wafer) may occur. This results in a decrease in yield.

Therefore, there is known a plasma processing apparatus in which a focus ring has a plurality of flat portions having different heights. By using the focus ring having a plurality of flat portions with different heights, tilting on the target substrate is suppressed (see, e.g., Japanese Patent Application Publication No. 2016-225588).

However, the above-described technique does not take into consideration suppressing the tilting that occurs on the target substrate during plasma processing that involves the changing of the magnitude of bias power.

It is generally known that when the magnitude of the bias power changes from a relatively low value to a relatively high value, for example, the height relation between a plasma sheath above the target substrate and that above the focus ring generally depends on a difference between the impedance between the target substrate and the base and the impedance between the focus ring and the base. If there is a difference between the electrostatic capacitance of the central portion of the electrostatic chuck and the electrostatic capacitance of the outer peripheral portion of the electrostatic chuck, the impedance between the target substrate and the base is not matched with the impedance between the focus ring and the base. If the impedance between the target substrate and the base is not matched with the impedance between the focus ring and the base, the height relation between the plasma sheath above the target substrate and the plasma sheath above the focus ring tends to vary. As a result, variation in the inclination of an incidence angle of particles such as the ions in the plasma on the target substrate is increased, which makes it difficult to suppress the variation in the inclination of the hole formed in the target substrate within predetermined specifications. In this specification, the electrostatic capacitance indicates the electrostatic capacitance per unit area.

In the plasma processing apparatus using the focus ring having a plurality of flat portions having different heights, when the magnitude of the bias power is changed, the height relation between the plasma sheath above the target substrate and the plasma sheath above the focus ring may vary and the inclination of the hole formed in the target substrate may vary greatly. Therefore, it is desired to suppress the tilting on the target substrate in the plasma processing that involves changing the magnitude of the bias power.

SUMMARY OF THE INVENTION

In accordance with an aspect, there is provided a plasma processing apparatus including: a base to which a bias power, whose magnitude is changed during plasma processing on a target substrate, is applied; an electrostatic chuck, provided on the base, having a central portion on which the target substrate is mounted and an outer peripheral portion on which a focus ring is mounted to surround the target substrate; and a dielectric layer, provided between the outer peripheral portion of the electrostatic and the base or the focus ring, having an electrostatic capacitance that reduces a difference between an electrostatic capacitance of the central portion of the electrostatic chuck and an electrostatic capacitance of the outer peripheral portion of the electrostatic chuck.

In accordance with another aspect, there is provided a plasma processing apparatus including: a base to which a bias power, whose magnitude is changed during plasma processing on a target substrate, is applied; an electrostatic chuck, provided on the base, having a central portion on which the target substrate is mounted and an outer peripheral portion on which a focus ring is mounted to surround the target substrate; and a dielectric layer, provided between the outer peripheral portion of the electrostatic and the base or the focus ring, having an electrostatic capacitance per unit area which reduces a difference between an electrostatic capacitance per unit area of the central portion of the electrostatic chuck and an electrostatic capacitance per unit area of the outer peripheral portion of the electrostatic chuck.

In accordance with still another aspect, there is provided a plasma processing method for performing plasma processing on a target substrate by using the plasma processing apparatus described above.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
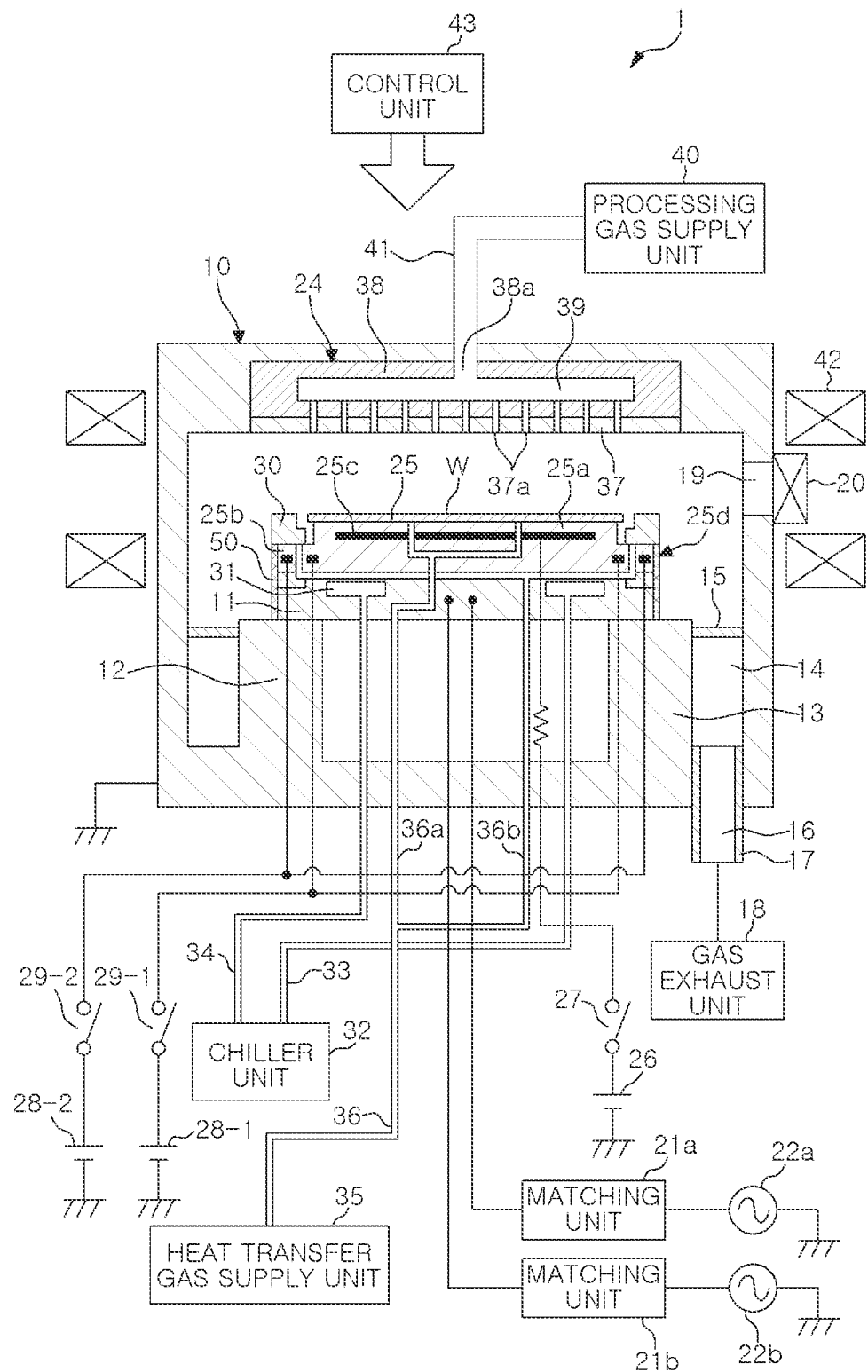
FIG. 1 is a cross sectional view showing a schematic configuration of a plasma processing apparatus according to an embodiment.

Hereinafter, embodiments will be described in detail with reference to the accompanying drawings. Like reference numerals will be given to like or corresponding parts throughout the drawings.

(Configuration of Plasma Processing Apparatus)

FIG. 1 is a cross sectional view showing a schematic configuration of a plasma processing apparatus 1 according to an embodiment. The plasma processing apparatus 1 shown in FIG. 1 is configured as, e.g., a plasma etching apparatus using a capacitively coupled plasma (CCP).

Referring to FIG. 1, the plasma processing apparatus 1 includes a cylindrical processing chamber 10 made of a metal, e.g., aluminum or stainless steel. The processing chamber is frame grounded. A disc-shaped base (susceptor) 11 is provided in the processing chamber 10. The base 11 is made of, e.g., aluminum, and is supported by a tubular support 13 extending vertically upward from a bottom portion of the processing chamber 10 via an insulating cylindrical holding member 12. The base 11 serves as a lower electrode.

A gas exhaust path 14 is formed between a sidewall of the processing chamber 10 and the cylindrical support 13. An annular baffle plate 15 is provided at an inlet of the gas exhaust path 14 or in the gas exhaust path 14. A gas exhaust port 16 is provided at a bottom portion of the processing chamber 10. A gas exhaust unit 18 is connected to the gas exhaust port 16 through a gas exhaust line 17. The gas exhaust unit 18 includes a vacuum pump, and reduces the pressure in the processing space in the processing chamber 10 to a predetermined vacuum level. The gas exhaust line 17 has an automatic pressure control valve (hereinafter, referred to as "APC") (not shown) that is a variable butterfly valve. The APC automatically controls a pressure in the processing chamber 10. A gate valve 20 for opening/closing a loading/unloading port 19 for the wafer W is provided at the sidewall of the processing chamber 10.

A high frequency power supply 22a is electrically connected to the base 11 serving as the lower electrode via a matching unit 21a. A high frequency power supply 22b is electrically connected to the base 11 via a matching unit 21b. The high frequency power supply 22a is a power supply for plasma generation and applies a high frequency power having a predetermined high frequency to the base 11. The high frequency power supply 22b is a power supply for ion attraction and applies a high frequency power having a frequency lower than that of the high frequency power of the high frequency power supply 22a to the base 11. The high frequency power applied from the high frequency power supply 22b to the base 11 is a high frequency power for attracting ions in plasma to the wafer W that is an example of the target substrate and also referred to as "bias power". The high frequency power supply 22b switches a magnitude of the bias power between a relatively low value and a relatively high value in response to an instruction from a control unit 43 during the plasma processing on the wafer W.

A shower head 24 serving as an upper electrode having a ground potential, which will be described later, is provided at a ceiling portion of the processing chamber 10. Accordingly, a high frequency voltage from the high frequency power supply 22a is applied to a space between the base 11 and the shower head 24.

An electrostatic chuck 25 for attracting and holding the wafer W by an electrostatic attraction force is provided on an upper surface of the base 11. The electrostatic chuck has a disc-shaped central portion 25a and an annular outer peripheral portion 25b. The wafer W is mounted on the central portion 25a, and a focus ring 30 is mounted on the outer peripheral portion 25b to surround the wafer W. The central portion 25a protrudes upward in the drawing with respect to the outer peripheral portion 25b. The central portion 25a is thicker than the outer peripheral portion 25b. The central portion 25a is formed by embedding an electrode plate 25c made of a conductive film between two dielectric films. The outer peripheral portion 25b is formed by embedding an electrode plate 25d made of a conductive film between two dielectric films. A DC power supply 26 is electrically connected to the electrode plate 25c through a switch 27. DC power supplies 28-1 and 28-2 are electrically connected to the electrode plate 25d through switches 29-1 and 29-2, respectively. An electrostatic attraction force such as Coulomb force or the like is generated by the voltage applied from the DC power supply 26 to the electrode plate 25c, and the wafer W is attracted to and held on the electrostatic chuck 25 by the electrostatic attraction force. Further, an electrostatic attraction force such as Coulomb force or the like is generated by the voltage applied from the DC power supplies 28-1 and 28-2 to the electrode plate 25d, and the focus ring 30 is attracted to and held on the electrostatic chuck 25 by the electrostatic attraction force. The structure in the vicinity of the electrostatic chuck 25 will be described later.

An annular coolant path 31 extending in, e.g., a circumferential direction, is provided in the base 11. A coolant, e.g., cooling water, of a predetermined temperature is supplied from a chiller unit 32 and circulated in the coolant path 31 through lines 33 and 34. A temperature of the wafer W on the central portion 25a of the electrostatic chuck 25 and a temperature of the focus ring 30 are controlled by a temperature of the coolant.

A heat transfer gas supply unit 35 is connected to the electrostatic chuck 25 through a gas supply line 36. The gas supply line 36 is branched into a wafer side line 36a reaching the central portion 25a of the electrostatic chuck and a focus ring side line 36b reaching the outer peripheral portion 25b of the electrostatic chuck 25. The heat transfer gas supply unit 35 supplies a heat transfer gas to the space between the central portion 25a of the electrostatic chuck 25 and the wafer W through the wafer side line 36a. The heat transfer gas supply unit 35 supplies the heat transfer gas to the space between the outer peripheral portion 25b of the electrostatic chuck 25 and the focus ring 30 through the focus ring side line 36b. A thermally conductive gas, e.g., He gas or the like, is suitable for the heat transfer gas.

The shower head 24 provided at the ceiling portion includes an electrode plate 37 as a bottom surface having a plurality of gas injection holes 37a and an electrode holder detachably holding the electrode plate 37. A buffer space 39 is provided in the electrode holder 38. A gas supply line 41 from a processing gas supply unit 40 is connected to a gas inlet port 38a of the buffer space 39. A magnet 42 extending annularly or concentrically is provided around the processing chamber 10.

The operation of the plasma processing apparatus 1 configured as described above is integrally controlled by the control unit 43. The control unit 43 is, e.g., a computer, and controls the respective components of the plasma processing apparatus 1.

The control unit 43 includes a central processing unit (CPU) (not shown) and a storage device such as a memory. The control unit 43 reads out and executes a program and a processing recipe stored in the storage device to control the respective components of the plasma processing apparatus 1 and perform predetermined plasma processing on the wafer W.

In the plasma processing apparatus 1 configured as described above, in the case of performing etching on the wafer W, first, the gate valve 20 is opened and, then, the wafer W as an etching target is loaded into the processing chamber 10 and mounted on the electrostatic chuck 25. Next, a predetermined DC voltage is applied from the DC power supply 26 to the electrode plate 25c, and the wafer W is attracted to and held on the central portion 25a of the electrostatic chuck 25. A predetermined DC voltage is applied from the DC power supplies 28-1 and 28-2 to the electrode plate 25d, and the focus ring 30 is attracted to and held on the outer peripheral portion 25b of the electrostatic chuck 25.

Then, an etching gas is supplied at a predetermined flow rate from the processing gas supply unit 40 to the buffer space 39, and then supplied into the processing chamber 10 through the gas injection holes 37a. The processing chamber 10 is exhausted by the gas exhaust unit 18, and a pressure in the processing chamber 10 is controlled to a predetermined level. In a state where the processing gas is supplied into the processing chamber 10, the high frequency power for plasma generation is applied from the high frequency power supply 22a to the base 11 and the high frequency power for ion attraction (i.e., bias power) is applied from the high frequency power supply 22b to the base 11.

The processing gas injected through the gas injection holes 37a of the shower head 24 is converted into plasma in glow discharge generated between the shower head 24 and the base 11 by the high frequency electric power applied to the base 11. A surface to be processed of the wafer W is etched by radicals or ions in the plasma of the processing gas, and a hole is formed on the surface to be processed of the wafer W.

In the present embodiment, the control unit 43 switches the magnitude of the bias power applied to the base between a relatively low value and a relatively high value by controlling the high frequency power supply 22b during the plasma processing on the wafer W.

(Structure in the Vicinity of Electrostatic Chuck)

Figure 2:
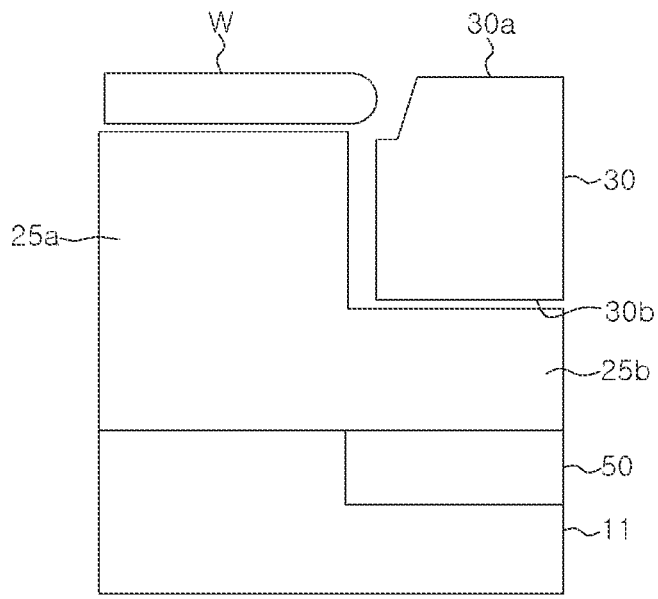
FIG. 2 is an enlarged cross sectional view showing a base, an electrostatic chuck, a wafer and a focus ring.

Next, the structure in the vicinity of the electrostatic chuck 25 will be described with reference to FIG. 2. FIG. 2 is an enlarged cross sectional view showing the base 11, the electrostatic chuck 25, the wafer W, and the focus ring 30.

As shown in FIG. 2, the wafer W is mounted on the central portion 25a of the electrostatic chuck 25, and the focus ring 30 is mounted on the outer peripheral portion 25b to surround the wafer W. The focus ring 30 is made of a conductive member, e.g., silicon or the like. The focus ring 30 is mounted on the outer peripheral portion 25b of the electrostatic chuck 25 in a state where an entire lower surface 30b of the focus ring 30 is in contact with the outer peripheral portion 25b of the electrostatic chuck 25. In a state where the wafer W is mounted on the central portion 25a of the electrostatic chuck 25 and the focus ring is mounted on the outer peripheral portion 25b of the electrostatic chuck 25, a height of an upper surface 30a of the focus ring 30 is equal to that of the upper surface of the wafer W.

A dielectric layer 50 is disposed between the outer peripheral portion 25b of the electrostatic chuck 25 and the base 11. As described above, the central portion 25a of the electrostatic chuck 25 protrudes upward with respect to the outer peripheral portion 25b of the electrostatic chuck 25 and is thicker than the outer peripheral portion 25b. Due to the difference in the thickness between the central portion 25a and the outer peripheral portion 25b, the electrostatic capacitance of the central portion 25a is smaller than that of the outer peripheral portion 25b. Therefore, the dielectric layer 50 has an electrostatic capacitance that reduces the difference between the electrostatic capacitance of the central portion 25a of the electrostatic chuck 25 and the electrostatic capacitance of the outer peripheral portion 25b of the electrostatic chuck 25. Specifically, a thickness and a relative dielectric constant of the dielectric layer 50 are selected such that a combined electrostatic capacitance of the electrostatic capacitance of the dielectric layer 50 and that of the outer peripheral portion 25b of the electrostatic chuck 25 is equal to the electrostatic capacitance of the central portion 25a of the electrostatic chuck 25. Accordingly, an impedance between the base 11 and the focus ring 30 with the outer peripheral portion 25b of the chuck 25 interposed therebetween is matched with the impedance between the base and the wafer W with the central portion 25a of the electrostatic chuck 25 interposed therebetween.

Figure 3:
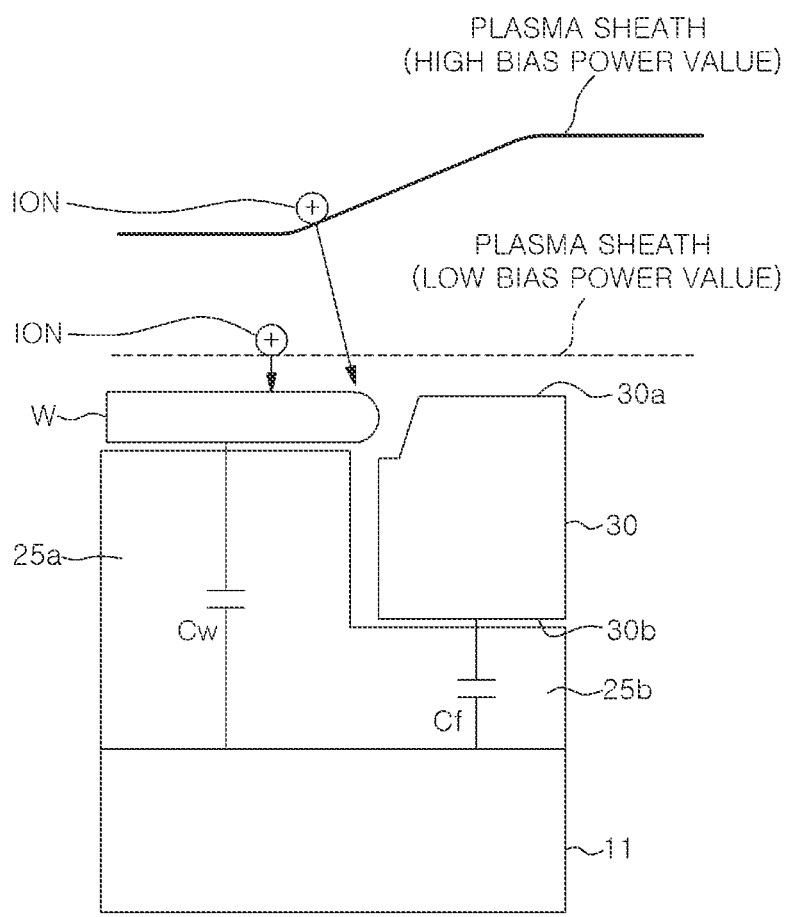
FIG. 3 shows an example of an equivalent circuit in the vicinity of the electrostatic chuck in the case where a dielectric layer is not disposed between an outer peripheral portion of the electrostatic chuck and the base.
Figure 4:
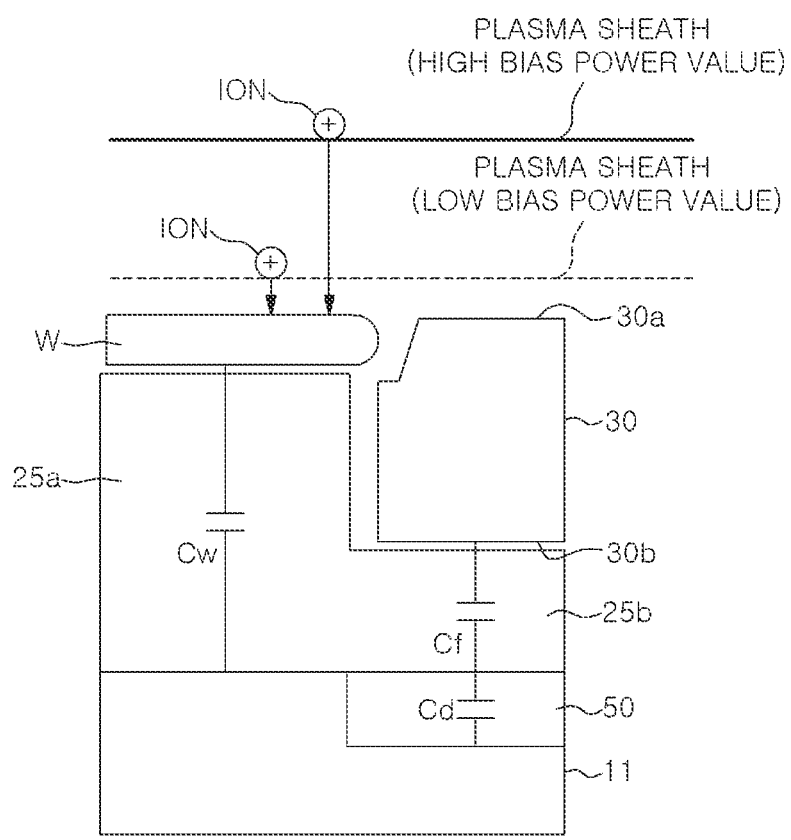
FIG. 4 shows an example of an equivalent circuit in the vicinity of the electrostatic chuck in the case where a dielectric layer is disposed between the outer peripheral portion of the electrostatic chuck and the base.

Hereinafter, the effect of the dielectric layer 50 will be described by using an equivalent circuit in the vicinity of the electrostatic chuck 25. FIG. 3 shows an example of an equivalent circuit in the vicinity of the electrostatic chuck 25 in the case where the dielectric layer 50 is not disposed between the outer peripheral portion 25b of the electrostatic chuck 25 and the base 11. FIG. 4 shows an example of an equivalent circuit in the vicinity of the electrostatic chuck 25 in the case where the dielectric layer 50 is disposed between the outer peripheral portion 25b of the electrostatic chuck 25 and the base 11.

In FIGS. 3 and 4, the electrostatic capacitance of the central portion 25a of the electrostatic chuck 25 is defined as $C_w$, and the electrostatic capacitance of the outer peripheral portion 25b of the electrostatic chuck 25 is defined as $C_f$. In FIG. 4, the electrostatic capacitance of the dielectric layer 50 is defined as $C_d$. Since the central portion 25a of the electrostatic chuck 25 is thicker than the outer peripheral portion 25b of the electrostatic chuck 25, the electrostatic capacitance $C_w$ is smaller than the electrostatic capacitance $C_f$.

First, as shown in FIG. 3, it is assumed that the dielectric layer 50 is not disposed between the outer peripheral portion 25b of the electrostatic chuck 25 and the base 11. When the bias power applied to the base 11 is changed to a relatively low value (hereinafter, referred to as "low bias power value") during the plasma processing, both of the height of the plasma sheath above the focus ring and the height of the plasma sheath above the wafer W are decreased. Here, the height of the upper surface 30a of the focus ring 30 is equal to that of the upper surface of the wafer W and, thus, the height of the plasma sheath above the focus ring 30 is substantially equal to that of the plasma sheath above the wafer W, as indicated by the dashed line of FIG. 3. Then, in the vicinity of the edge portion of the wafer W, ions in the plasma are incident vertically on the surface to be processed of the wafer W. In the etching process, a hole is formed along the ion incidence direction. Therefore, in the vicinity of the edge portion of the wafer W, the hole formed on the processed surface of the wafer W has a shape in a depth direction which extends along the vertical direction.

Thereafter, when the bias power applied to the base 11 is changed to a relatively high value (hereinafter, referred to as "high bias power value"), both of the height of the plasma sheath above the focus ring 30 and the height of the plasma above the wafer W are increased. Here, it is known that when the bias power is changed to the high bias power value, the height relation between the plasma sheath above the wafer W and the plasma sheath above the focus ring 30 depends on a difference between the impedance between the wafer W and the base 11 and the impedance between the focus ring 30 and the base 11. When the dielectric layer 50 is not disposed, the impedance between the wafer W and the base 11 is proportional to a reciprocal of the electrostatic capacitance Cw, and the impedance between the focus ring 30 and the base 11 is proportional to a reciprocal of the electrostatic capacitance Cf. The electrostatic capacitance Cw is smaller than the electrostatic capacitance Cf. Therefore, the impedance between the wafer W and the base 11 is greater than the impedance between the focus ring 30 and the base 11. Accordingly, the height of the plasma sheath above the focus ring 30 is greater than the height of the plasma sheath above the wafer W, as indicated by the solid line of FIG. 3. Then, in the vicinity of the edge portion of the wafer W, ions in the plasma are incident on the surface to be processed of the wafer W while being inclined obliquely toward the edge portion of the wafer W. Therefore, in the vicinity of the edge portion of the wafer W, the hole formed on the processed surface of the wafer W has a shape that is obliquely inclined toward the edge portion of the wafer W with respect to the vertical direction. As a result, the tilting on the wafer W is increased.

On the other hand, as shown in FIG. 4, it is assumed that the dielectric layer 50 is disposed between the outer peripheral portion 25b of the electrostatic chuck 25 and the base 11. When the bias power applied to the base 11 is changed to the low bias power value during the plasma processing, both of the height of the plasma sheath above the focus ring 30 and the height of the plasma sheath above the wafer W are decreased. Here, the height of the upper surface 30a of the focus ring 30 is equal to that of the upper surface of the wafer W and, thus, the height of the plasma sheath above the focus ring 30 is equal to that of the plasma sheath above the wafer W. Then, in the vicinity of the edge portion of the wafer W, ions in the plasma are incident vertically to the surface to be processed of the wafer W. In the etching process, a hole is formed along the ion incidence direction. Therefore, in the vicinity of the edge portion the wafer W, the hole formed on the processed surface of the wafer W has a shape in a depth direction which extends along the vertical direction.

Thereafter, when the bias power applied to the base 11 is changed to the high bias power value, both of the height of the plasma sheath above the focus ring 30 and the height of the plasma sheath above the wafer W are increased. Here, it is known that when the bias power is changed to the high bias power value, the height relation between the plasma sheath above the wafer W and the plasma sheath above the focus ring 30 depends on the difference between the impedance between the wafer W and the base 11 and the impedance between the focus ring 30 and the base 11. When the dielectric layer 50 is disposed, the impedance between the wafer W and the base 11 is proportional to a reciprocal of the electrostatic capacitance Cw, and the impedance between the focus ring 30 and the base 11 is proportional to a reciprocal of the combined electrostatic capacitance $(Cf \cdot Cd)/(Cf+Cd)$ of the electrostatic capacitance Cf and the electrostatic capacitance Cd. In the present embodiment, a thickness and a relative dielectric constant of the dielectric layer 50 are selected such that the combined electrostatic capacitance $(Cf \cdot Cd)/(Cf+Cd)$ is equal to the electrostatic capacitance Cw. Accordingly, the impedance between the base 11 and the focus ring 30 with the dielectric layer 50 and the outer peripheral portion 25b of the electrostatic chuck 25 interposed therebetween is matched with the impedance between the base 11 and the wafer W with the central portion 25a of the electrostatic chuck 25 interposed therebetween. Thus, the height of the plasma sheath above the focus ring 30 is equal to that of the plasma sheath above the wafer W, as indicated by the solid line of FIG. 4. Then, in the vicinity of the edge portion of the wafer W, ions in the plasma are incident vertically to the surface to be processed of the wafer W. Therefore, in the vicinity of the edge portion of the wafer W, the hole formed on the processed surface of the wafer W has a shape in a depth direction which extends along the vertical direction. In other words, by disposing the dielectric layer 50 as in this embodiment, it is possible to suppress tilting caused by the change in the magnitude of the bias power in the plasma processing in which the bias power is changed between a low bias power value and a high bias power value.

Figure 5:
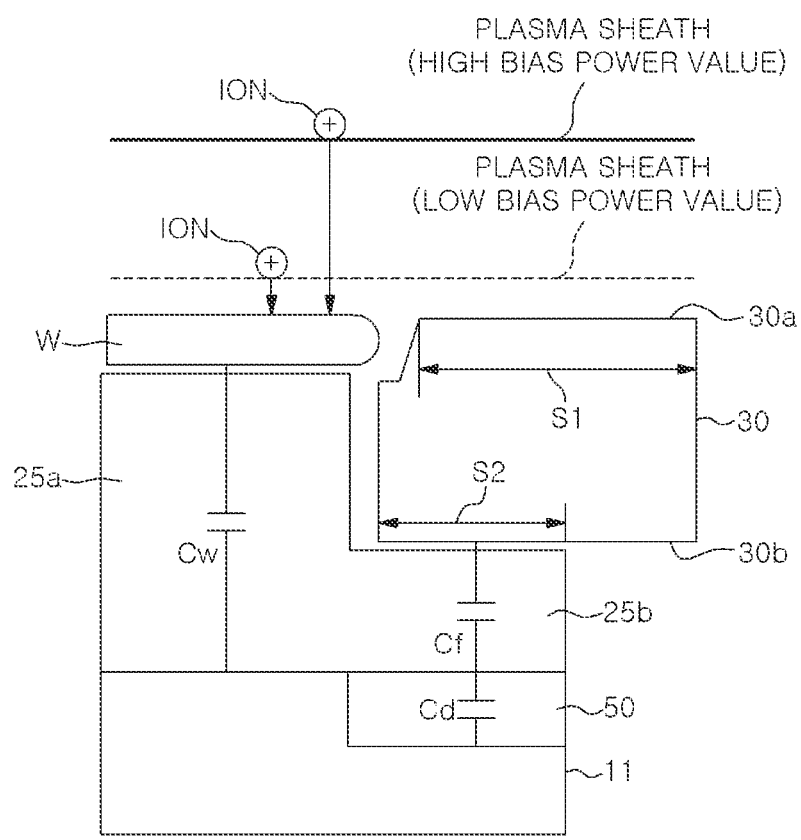
FIG. 5 shows another example of the equivalent circuit in the vicinity of the electrostatic chuck in the case where a dielectric layer is disposed between the outer peripheral portion of the electrostatic chuck and the base.

In the above description, the thickness and the relative dielectric constant of the dielectric layer 50 are selected such that the combined electrostatic capacitance $(Cf \cdot Cd)/(Cf+Cd)$ is equal to the electrostatic capacitance Cw. However, the present disclosure is not limited thereto, and it is also possible to select the thickness and the relative dielectric constant of the dielectric layer 50 while considering that a part of the lower surface 30b of the focus ring 30 is in contact with the outer peripheral portion 25b of the electrostatic chuck 25. FIG. 5 shows another example of an equivalent circuit in the vicinity of the electrostatic chuck in the case where the dielectric layer is disposed between the outer peripheral portion of the electrostatic chuck and the base. In the example shown in FIG. 5, the focus ring 30 is mounted on the outer peripheral portion 25b of the electrostatic chuck 25 in a state where a part of the lower surface 30b of the focus ring 30 is in contact with the outer peripheral portion 25b of the electrostatic chuck 25. In FIG. 5, an area of the upper surface 30a of the focus ring 30 which is exposed to the plasma is defined as S1, and an area of a part of the lower surface 30b of the focus ring 30 which is in contact with the outer peripheral portion 25b of the electrostatic chuck 25 is defined as S2. In that case, the thickness and the relative dielectric constant of the dielectric layer 50 are selected such that a value obtained by multiplying the combined electrostatic capacitance $(Cf \cdot Cd)/(Cf+Cd)$ by a ratio of the area S2 to the area S1 is equal to the electrostatic capacitance Cw. Accordingly, the impedance between the base 11 and the focus ring 30 with the dielectric layer 50 and the outer peripheral portion 25b of the electrostatic chuck 25 interposed therebetween is more accurately matched with the impedance between the base 11 and the wafer W with the central portion 25a of the electrostatic chuck 25 interposed therebetween.

Referring back to FIG. 2, the dielectric layer 50 is formed on the base 11 without an adhesive interposed therebetween. Specifically, as shown in FIG. 2, the dielectric layer 50 is formed in a recess formed on a region of the upper surface of the base 11 which corresponds to the outer peripheral portion 25b of the electrostatic chuck 25 by thermal spraying or coating.

Since the dielectric layer 50 is formed on the base 11 without the adhesive interposed therebetween, the heat transfer from the focus ring 30 to the base 11 is not hindered. Accordingly, the increase in the temperature of the focus ring 30 can be suppressed.

Figures 6, 7:
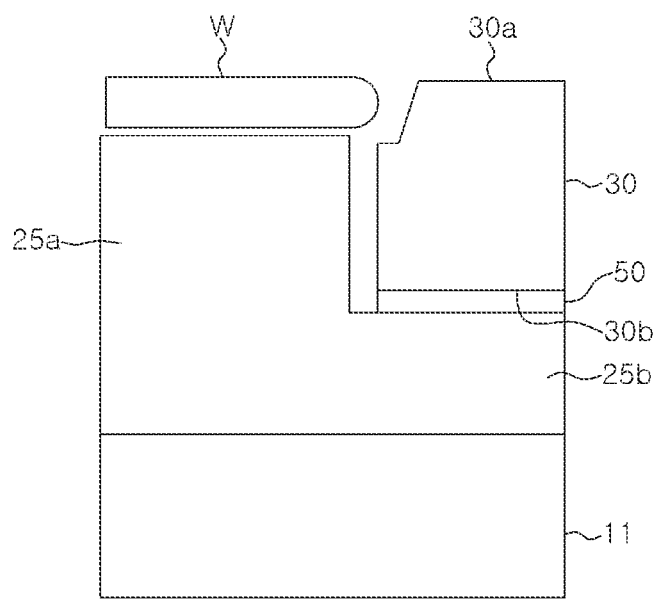
FIG. 6 shows a modified arrangement of a dielectric layer.
FIG. 7 shows an exemplary measurement result of the relation between the magnitude of bias power and the inclination angle of a hole.

Next, modified arrangement of the dielectric layer 50 will be described. FIG. 6 shows the modified arrangement of the dielectric layer 50. In the above embodiment, the dielectric layer 50 is disposed between the outer peripheral portion 25b of the electrostatic chuck 25 and the base 11. However, as shown in FIG. 6, for example, the dielectric layer 50 may be disposed between the outer peripheral portion 25b of the electrostatic chuck 25 and the focus ring 30. Similarly to the dielectric layer 50 shown in FIG. 2, the dielectric layer 50 shown in FIG. 6 has an electrostatic capacitance that reduces the difference between the electrostatic capacitance of the central portion 25a of the electrostatic chuck 25 and the electrostatic capacitance of the outer peripheral portion 25b of the electrostatic chuck 25. Specifically, the thickness and the relative dielectric constant of the dielectric layer 50 are selected such that the combined electrostatic capacitance of the electrostatic capacitance of the dielectric layer 50 and the electrostatic capacitance of the outer peripheral portion 25b of the electrostatic chuck 25 is equal to the electrostatic capacitance of the central portion 25a of the electrostatic chuck 25. Accordingly, the impedance between the base 11 and the focus ring 30 with the dielectric layer 50 and the outer peripheral portion 25b of the electrostatic chuck 25 interposed therebetween is matched with the impedance between the base 11 and the wafer W with the central portion 25a of the electrostatic chuck 25 interposed therebetween.

In the above description, the impedance is matched by the thickness and the relative dielectric constant of the dielectric layer 50. However, the present disclosure is not limited thereto. For example, the impedance may be matched by adjusting the thickness of the base for the wafer or the thickness of the base for the focus ring.

(Relation Between Magnitude of Bias Power and Inclination Angle of Hole)

Next, an effect of the plasma processing apparatus 1 according to an embodiment (measurement result of the relation between the magnitude of the bias power and the inclination angle of the hole) will be described. FIG. 7 shows an exemplary measurement result of the relation between the magnitude of the bias power and the inclination angle of the hole.

In FIG. 7, "Comparative Example" shows a measurement result of an inclination angle θ of a hole in the case of performing etching that involves changing of the magnitude of the bias power by using a plasma processing apparatus in which the dielectric layer 50 is not disposed between the outer peripheral portion 25b of the electrostatic chuck 25 and the base 11. "Test Example 1" shows a measurement result of an inclination angle θ of a hole in the case of performing etching that involves changing of the magnitude of the bias power by using the plasma processing apparatus 1 in which the dielectric layer 50 is disposed between the outer peripheral portion 25b of the electrostatic chuck 25 and the base 11. "Test Example 2" shows a measurement result of an inclination angle θ of a hole in the case of performing etching that involves changing of the magnitude of the bias power by using the plasma processing apparatus 1 in which the dielectric layer 50 is disposed between the outer peripheral portion 25b of the electrostatic chuck 25 and the focus ring 30. In the "comparative example", the height of the focus ring 30 is adjusted such that the inclination angle θ of the hole in the case of changing the bias power applied to the base 11 to 14000 W that is the high bias electric power value becomes approximately the same.

In FIG. 7, it is assumed that the bias power applied to the base 11 is changed to 2000 W that is the low bias electric power value and 14000 W that is the high bias electric power value. Further, in FIG. 7, the inclination angle θ of the hole is defined as an angle in a depth direction of the hole with respect to the vertical direction. In other words, when the hole formed in the wafer W is inclined obliquely toward the outer peripheral portion of the surface to be processed of the wafer W, the inclination angle θ of the hole has a positive value. On the other hand, when the hole formed in the wafer W is inclined obliquely toward the central portion of the surface to be processed of the wafer W, the hole inclination angle θ has a negative value.

As shown in FIG. 7, in the comparative example, when the magnitude of the bias power was changed, the variation Δθ in the inclination angle θ of the hole was 0.48 deg.

On the other hand, in the test example 1, when the magnitude of the bias power was changed, the variation Δθ of the inclination angle θ of the hole was 0.06 deg. In the test example 2, when the magnitude of the bias power was changed, the variation Δθ of the inclination angle θ of the hole was 0.35 deg. In other words, in the test examples 1 and 2, tilting on the wafer W can be suppressed in the etching involving changing of the magnitude of the bias power, compared to the comparative example.

In the test example 2, the variation Δθ of the inclination angle θ of the hole is greater than that in the test example 1. This is because the impedance between the base 11 and the focus ring 30 in the test example 2 is higher than the impedance between the base 11 and the wafer W with the central portion 25a of the electrostatic chuck 25 interposed therebetween. If the impedance between the base 11 and the focus ring 30 is too high, the variation Δθ in the inclination angle θ of the hole is increased, which is not preferable.

(Simulation Result of Temperature Distribution of Focus Ring 30)

Figure 8:
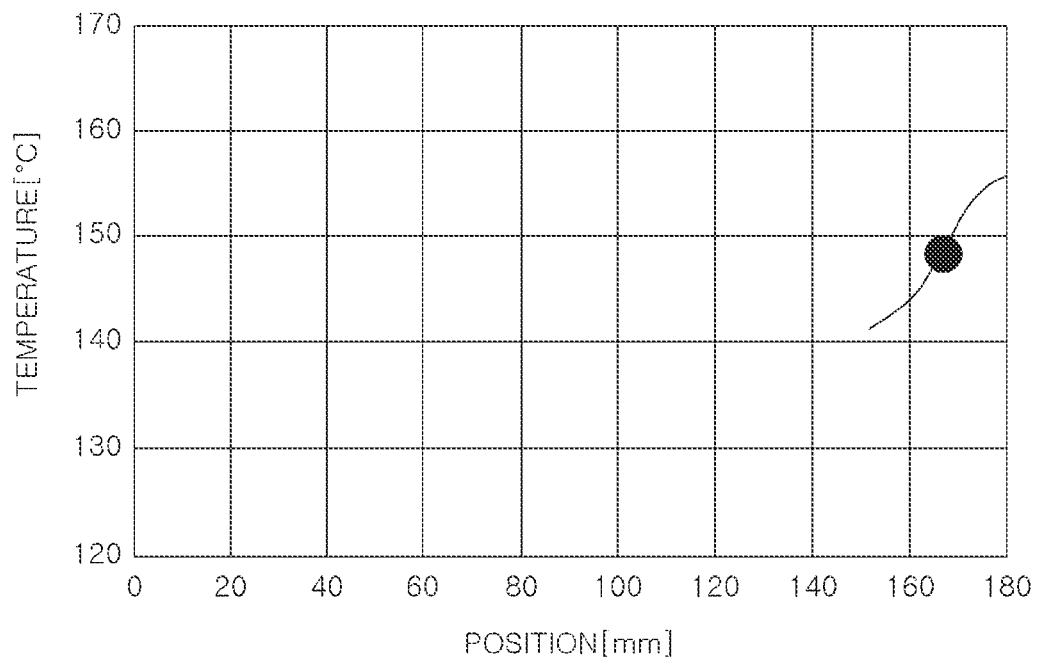
FIG. 8 shows a simulation result of the temperature distribution of a focus ring in a plasma processing apparatus (comparative example) in which a dielectric layer is not disposed between the outer peripheral portion of the electrostatic chuck and the base.
Figure 9:
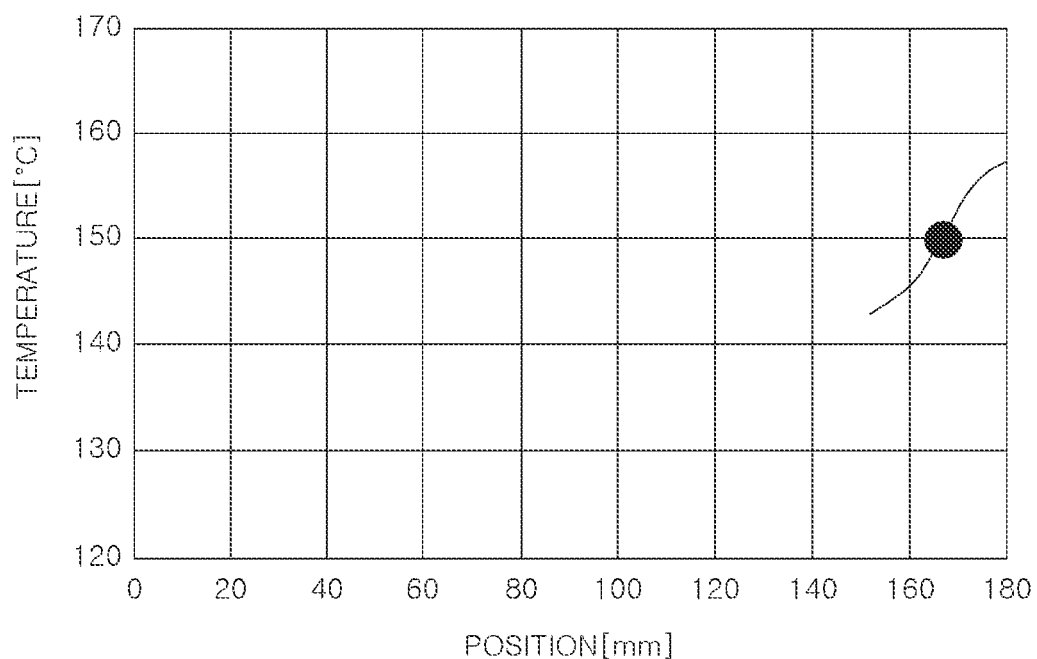
FIG. 9 shows a simulation result of the temperature distribution of a focus ring in a plasma processing apparatus (test example) in which a dielectric layer is disposed between the outer peripheral portion of the electrostatic chuck and the base.

Next, an effect (simulation result of temperature distribution of the focus ring 30) of the plasma processing apparatus 1 according to an embodiment will be described. FIG. 8 shows a simulation result of the temperature distribution of the focus ring 30 in the plasma processing apparatus (comparative example) in which the dielectric layer 50 is not disposed between the outer circumferential portion 25b of the electrostatic chuck 25 and the base 11. FIG. 9 shows a simulation result of the temperature distribution of the focus ring 30 in the plasma processing apparatus 1 (test example) in which the dielectric layer 50 is disposed between the outer peripheral portion 25b of the electrostatic chuck 25 and the base 11.

As shown in FIGS. 8 and 9, the temperature distribution of the focus ring 30 in the test example is substantially the same as that in the comparative example. In other words, in the test embodiment, the dielectric layer 50 is formed on the base 11 without an adhesive interposed therebetween. Therefore, the heat transfer from the focus ring 30 to the base 11 is not hindered, and the increase in the temperature of the focus ring 30 can be suppressed.

In accordance with the above embodiment, the dielectric layer 50 is disposed between the base 11 and the outer peripheral portion 25b of the electrostatic chuck 25 provided on the base 11 to which the bias power whose magnitude is changed during the plasma processing on the wafer W is applied or between the focus ring 11 and the outer peripheral portion 25b of the electrostatic chuck 25. Accordingly, tilting on the wafer W can be suppressed in the plasma processing that involves changing the magnitude of the bias power.

Further, in accordance with the above embodiment, the dielectric layer 50 is formed on the base 11 without an adhesive interposed therebetween. Therefore, the heat transfer from the focus ring 30 to the base 11 is not hindered, and the increased in the temperature of the focus ring 30 can be suppressed.

The present disclosure is not limited to the above-described embodiments, and various modifications can be made within the scope of the gist of the present disclosure.

For example, in the above-described embodiment, the electrostatic chuck 25 attracts and holds the focus ring 30 by the electrostatic attraction force. However, the electrostatic chuck 25 may not attract and hold the focus ring 30. In that case, the electrode plate 25d is omitted from the electrostatic chuck 25.

In the above embodiment, the plasma processing apparatus 1 is configured as a CCP type plasma etching apparatus. However, the plasma processing apparatus 1 may employ any plasma source. For example, the plasma processing apparatus 1 may employ as the plasma source an inductively coupled plasma (ICP), a radial line slot antenna, an electron cyclotron resonance plasma (ECR), a helicon wave plasma (HWP), and the like.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising: a plasma processing chamber; a base disposed in the plasma processing chamber; an electrostatic chuck, disposed on the base, having a substrate support portion and a focus ring support portion on which a focus ring is disposed to surround a substrate; a RF power source electrically connected to the base; a dielectric layer disposed between the base and the focus ring support portion; and a controller configured to control the RF power source to change a power level of a RF power applied from the RF power source to the base, wherein the base includes a first surface which is in contact with the electrostatic chuck and a second surface which is not in contact with the electrostatic chuck, the dielectric layer is disposed between the focus ring support portion and the second surface of the base, and the dielectric layer has a thickness and a relative dielectric constant such that a combined electrostatic capacitance of an electrostatic capacitance of the dielectric layer and an electrostatic capacitance of the focus ring support portion is equal to an electrostatic capacitance of the substrate support portion.

2. The plasma processing apparatus of claim 1, wherein the second surface is located directly below the focus ring support portion.

3. The plasma processing apparatus of claim 1, wherein a part of a lower surface of the focus ring is not in contact with the focus ring support portion.

4. The plasma processing apparatus of claim 2, wherein a part of a lower surface of the focus ring is not in contact with the focus ring support portion.

5. The plasma processing apparatus of claim 3, wherein a thickness and a relative dielectric constant of the dielectric layer are selected such that a value obtained by multiplying a combined electrostatic capacitance of an electrostatic capacitance of the dielectric layer and the electrostatic capacitance of the focus ring support portion by a ratio of an area of a part of the lower surface of the focus ring in contact with the focus ring support portion to an area of an upper surface of the focus ring is equal to the electrostatic capacitance of the substrate support portion.

6. The plasma processing apparatus of claim 1, wherein the dielectric layer is formed on the base without an adhesive interposed therebetween.

7. The plasma processing apparatus of claim 1, wherein the substrate support portion of the electrostatic chuck is thicker than the focus ring support portion of the electrostatic chuck.

8. The plasma processing apparatus of claim 1, wherein the controller is configured to control the RF power source to switch the power level of the RF power applied to the base between a first value and a second value higher than the first value during a plasma processing of the substrate.

9. A plasma processing apparatus comprising: a plasma processing chamber; a substrate support disposed in the plasma processing chamber, the substrate support including: an electrode; an electrostatic chuck having a substrate support portion on which a substrate is disposed and an annular portion; a conductive ring disposed to surround the substrate on the substrate support portion; and a dielectric layer disposed between the annular portion of the electrostatic chuck and the conductive ring; a RF power source electrically connected to the electrode; and a controller configured to control the RF power source to change a power level of a RF power applied from the RF power source to the electrode wherein the dielectric layer has a thickness and a relative dielectric constant such that a combined electrostatic capacitance of an electrostatic capacitance of the dielectric layer and an electrostatic capacitance of the annular portion is equal to an electrostatic capacitance of the substrate support portion.

10. The plasma processing apparatus of claim 9, wherein the annular portion of the electrostatic chuck is disposed to surround the substrate support portion of the electrostatic chuck, and wherein the substrate support portion of the electrostatic chuck is thicker than the annular portion of the electrostatic chuck.

11. The plasma processing apparatus of claim 9, wherein the dielectric layer is formed on the annular portion of the electrostatic chuck without an adhesive interposed therebetween.

12. The plasma processing apparatus of claim 9, wherein the controller is configured to control the RF power source to switch the power level of the RF power applied to the electrode between a first value and a second value higher than the first value during a plasma processing of the substrate.

* * * * *